United States Patent [19]

Nimishakavi

[11] Patent Number: 5,594,763
[45] Date of Patent: Jan. 14, 1997

[54] FAST SYNCHRONIZING DIGITAL PHASE-LOCKED LOOP FOR RECOVERING CLOCK INFORMATION FROM ENCODED DATA

[75] Inventor: Hanumanthrao Nimishakavi, Fremont, Calif.

[73] Assignee: Cirrus Logic, Inc., Fremont, Calif.

[21] Appl. No.: 467,645

[22] Filed: Jun. 6, 1995

[51] Int. Cl.⁶ ........................................... H03D 3/24
[52] U.S. Cl. ........................ 375/376; 327/156; 327/160
[58] Field of Search .................... 375/316, 371, 375/373, 375, 376; 331/14, 18, 23, 25, 34; 327/141, 142, 144, 147, 150, 151, 156, 159, 160, 162

[56] References Cited

U.S. PATENT DOCUMENTS

| | | | |
|---|---|---|---|
| 3,983,498 | 9/1976 | Malek | 331/25 |
| 4,280,099 | 7/1981 | Rattlingourd | 375/373 |
| 4,532,559 | 7/1985 | Long et al. | 360/51 |
| 4,646,004 | 2/1987 | Brandt et al. | 324/79 R |
| 4,680,780 | 7/1987 | Agoston et al. | 375/376 |
| 4,780,772 | 10/1988 | Shibuya et al. | 360/51 |
| 5,003,562 | 3/1991 | van Driest et al. | 375/373 |
| 5,131,015 | 7/1992 | Benjaram et al. | 375/377 |
| 5,281,926 | 1/1994 | Rabii | 331/14 |
| 5,313,496 | 5/1994 | de Goede | 375/342 |
| 5,315,270 | 5/1994 | Leonowich | 331/1 A |
| 5,459,419 | 10/1995 | Hatakenaka | 327/141 |

*Primary Examiner*—Benedict V. Safourek
*Assistant Examiner*—Paul Loomis
*Attorney, Agent, or Firm*—Lowe, Price, LeBlanc & Becker

[57] ABSTRACT

A digital phase-locked loop for receiving an encoded stream of data and generating a receive clock signal therefrom is provided with a counter, such as a down counter, having an adjustable start count value. An edge detector detects the rising and falling edges within a stream of data. The detection of an edge causes the counter to start counting from the start count value towards a terminal value. A receive clock generator is provided that generates a receive clock signal, the receive clock generator being responsive to the counter reaching at least a first predetermined value to change a level of the receive clock signal. The use of a down counter that is loaded with a start count value upon the detection of an edge provides fast re-synchronization when an edge has been missed, while providing accurate recovery of the clock from the encoded stream of data.

26 Claims, 5 Drawing Sheets

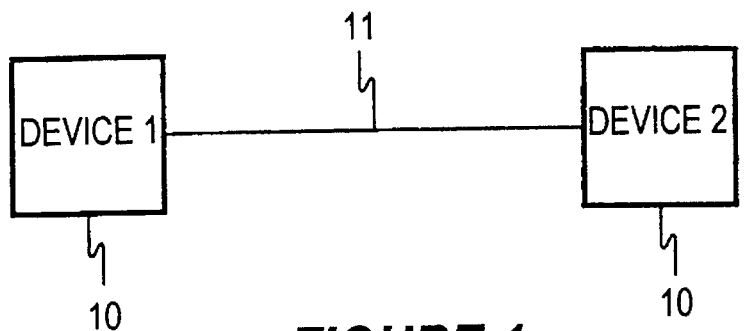
FIGURE 1
FIGURE 2
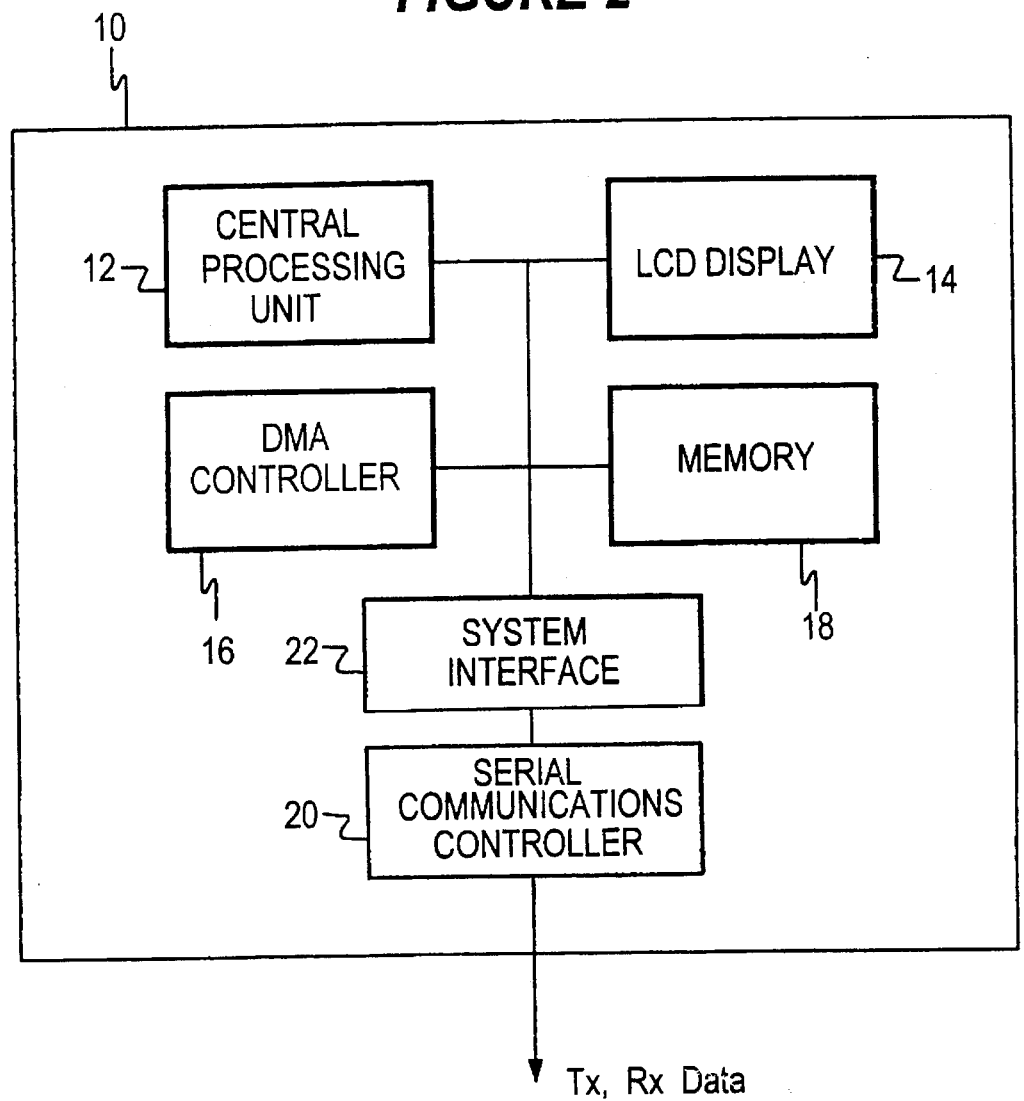

FAST SYNCHRONIZING DIGITAL PHASE-LOCKED LOOP FOR RECOVERING CLOCK INFORMATION FROM ENCODED DATA

BACKGROUND OF THE INVENTION

1. Technical Field of the Invention

The present invention relates to the field of digital data transfer, and more particularly, to a digital phase-locked loop that recovers clock information from a stream of encoded data.

2. Description of Related Art

Data encoding allows the transmission of clock and data information over the same medium. It saves the need to transmit the clock and data signals over separate mediums as would normally be required for synchronous data. Some well-known encoding schemes are NRZ (non-return to zero); NRZI (non-return to zero inverted), Manchester (biphase level) and FM encoding. A digital phase-locked loop (DPLL) is used to recover clock information from a data stream that has been encoded in one of these formats. Depending on the type of encoding, the DPLL is driven by a clock at different rates, for example, at 32 (NRZI) or 16 (FM) times the data rate. A DPLL will use this clock, along with the input data stream, to generate a receive clock for the data. The input data stream will then be sampled according to this receive clock.

It is ideal to perform the sampling of the input data stream in the middle of the bit times of the individual bits in the input data stream. This ideal sampling will occur when a counter in the DPLL, used to count the clock pulses driving the DPLL, is properly synchronized to the rising and falling edges of the input data stream. In the past, DPLL's have used up/down counters to perform a count of the clock pulses. The DPLL would then Generate a transition in the receive clock according to the value in this counter, the transition in the receive clock triggering the sampling of the data.

It is possible for the counter in a DPLL to become improperly synchronized to the rising and falling edges of the bit boundaries in the data stream, thereby causing the sampling to not occur in the middle of each bit time. Various schemes have been utilized in the prior art to re-synchronize the counter. For example, a DPLL manufactured by Zilog operates by shifting (when there is improper synchronization) the count laterally (plus or minus) by one bit at a time until proper synchronization is achieved. This lateral shifting by a single bit at a time causes the re-synchronization to occur relatively slowly.

In another DPLL, described in U.S. Pat. No. 5,131,015 and commonly assigned to Cirrus Logic, Inc. of California, different values of an adjustment are applied to a count register. This adjusts the count and thereby the phase in order to center data transitions so that these transitions will be detected when the value in the count register is equal to zero. This condition indicates that the DPLL is perfectly synchronized to the received data stream. Like the Zilog DPLL, the DPLL described in U.S. Pat. No. 5,131,015 uses an up/down counter and provides a relatively complicated scheme for re-synchronizing the counter and thereby the recovered clock signal.

SUMMARY OF THE INVENTION

There is a need for a digital phase-locked loop circuit (DPLL) that reduces the amount of logic in the circuit to thereby reduce power consumption and make the reliability of the clock higher, and that is also faster to re-synchronize when perfect synchronization has been lost.

This and other needs are met by the present invention which provides a digital phase-locked loop for receiving an encoded stream of data and generating a receive clock signal therefrom. The digital phase-locked loop comprises a counter having an adjustable start count value, an edge detector that detects rising and falling edges within a stream of data, the detection of an edge causing the counter to start counting from the start count value towards a terminal value, and a receive clock generator that generates a receive clock signal, the receive clock generator responsive to the counter reaching at least a first predetermined value to change a level of the receive clock signal.

Use of a counter that has an adjustable start count value as in the present invention provides the advantage of adjustability of the DPLL for use with a variety of different encoding formats. The use of the detected edge within the stream of data provides fast re-synchronization. For example, when the counter has reached the terminal value but the next edge (representing the next bit boundary) is not present due to a phase error, the edge detector will generate a signal when the next edge is detected. When this next edge is detected, representing the next bit boundary, the counter is once again caused to start counting from the start count value towards the terminal value. This re-synchronizes the counter and the recovered clock to the data.

The earlier stated needs are also met by another aspect of the present invention which provides a system for receiving a stream of encoded digital data and recovering clock information from the stream to clock receipt of the stream. The system comprises a processing unit, and a serial communications controller responsive to the processing unit and receiving the stream of encoded digital data. The serial communications controller includes a receiver that receives the stream of encoded digital data, and a digital phase-locked loop that receives the stream of encoded digital data and recovers the clock information therefrom. The digital phase-locked loop includes a counter having an adjustable start count value, an edge detector that detects rising and falling edges within a stream of data, the detection of an edge causing the counter to start counting from the start count value towards a terminal value, and a receive clock generator that generates a receive clock signal. The receive clock generator is responsive to the counter reaching at least a first predetermined value to change a level of the receive clock signal.

The earlier stated needs are also met by a method according to the present invention which provides a method of generating a receive clock signal from an encoded data stream with a digital phase-locked loop having a unidirectional counter, an edge detector, an edge detector enable, and a receive clock generator. The method comprises the steps of loading the counter with a start count value, driving the counter with a clock signal that is a multiple of a data rate of the stream of encoded data, detecting with the edge detector rising and falling edges within the stream of data, the detection of an edge causing the counter to start counting from the start count value towards a terminal value, and changing a level of a receive clock signal generated by the receive clock generator when the counter reaches at least one predetermined value.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 1 is a block diagram of a system having a plurality of devices in communication with one another.

FIG. 2 is a block diagram of a single device according to an exemplary embodiment of the present invention.

DETAILED DESCRIPTION OF THE ILLUSTRATIVE EMBODIMENTS

Figure 3:
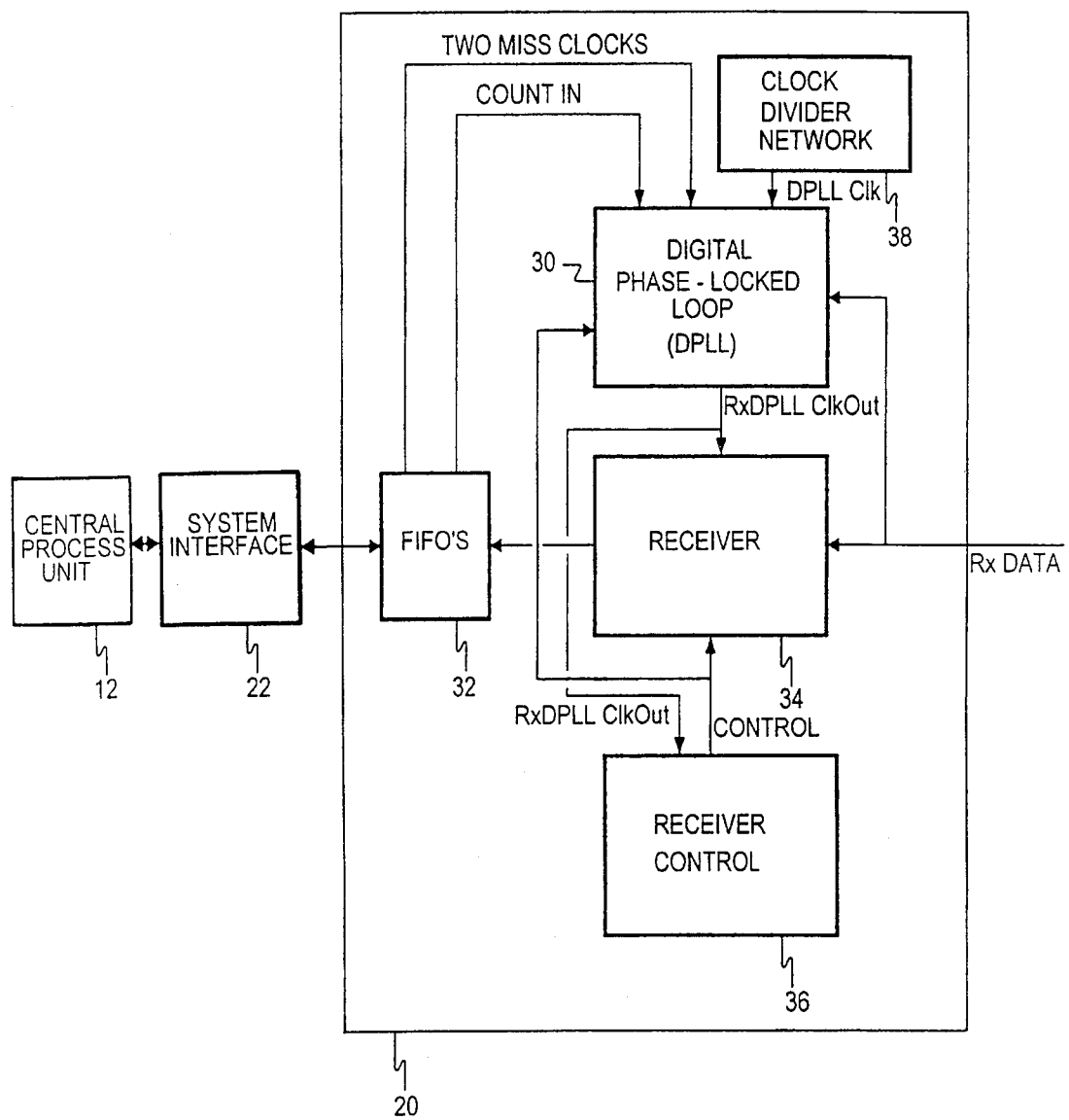
FIG. 3 is a block diagram of a serial communication controller constructed in accordance with an embodiment of the present invention.

FIG. 1 is a block diagram of a system in which a pair of devices are coupled with one another via a serial transmission link 11. Digital data is transferred over the link 11 between the two devices 10. In order to avoid the use of both clock and data lines, data is encoded prior to transmission and the clock is recovered by the receiving device 10. The data may be encoded in a number of different formats, such as NRZI and FM formats, as is well known.

An example of such a device 10 is a personal digital assistant, a basic block diagram of which is provided in FIG. 2. A personal digital assistant 10 has a central processing unit (CPU) 12, an LCD display 14, a DMA controller 16, a memory 18, a serial communication controller 20, and a system interface 22 coupled between the CPU 12 and the serial communication controller 20.

The serial communication controller 20 controls the transmission and reception of data to and from the personal digital assistant 10. Although the example of a personal digital assistant is described, device 10 may be any type of device which uses a digital phase-locked loop to recover a clock from the encoded data stream.

An exemplary embodiment of the serial communication controller 20 is provided in the block diagram of FIG. 3. The serial communication controller 20 is coupled to the CPU 12 through the system interface 22. The serial communication controller 20 includes a digital phase-locked loop (DPLL) 30 that receives data (Rx Data) from another device. This data is also received by a receiver 34. The data is eventually transferred to the CPU 12 through a set of first-in, first-out (FIFO) buffers 32 and the system interface 22.

A receiver control 36 operates to control the receiver 34 and the digital phase-locked loop 30 with control signals. The system controller 20 also includes a clock divider network 38 that provides the DPLL clock to the digital phase-locked loop 30. The DPLL clock is a multiple of the received data signal, such as 32 times the data rate of the received data signal, or 16 times the data rate, depending upon the encoding scheme of the data.

The digital phase-locked loop 30 receives a Count In signal from the CPU 12 through the FIFO's 32, as well as a Two Miss Clocks signal. The Count In signal is used to load a register with a count value to be loaded into the down counter, as will be described later. The Two Miss Clocks signal from the CPU 12 causes the digital phase-locked loop 30 to prepare to re-synchronize.

Figure 4:
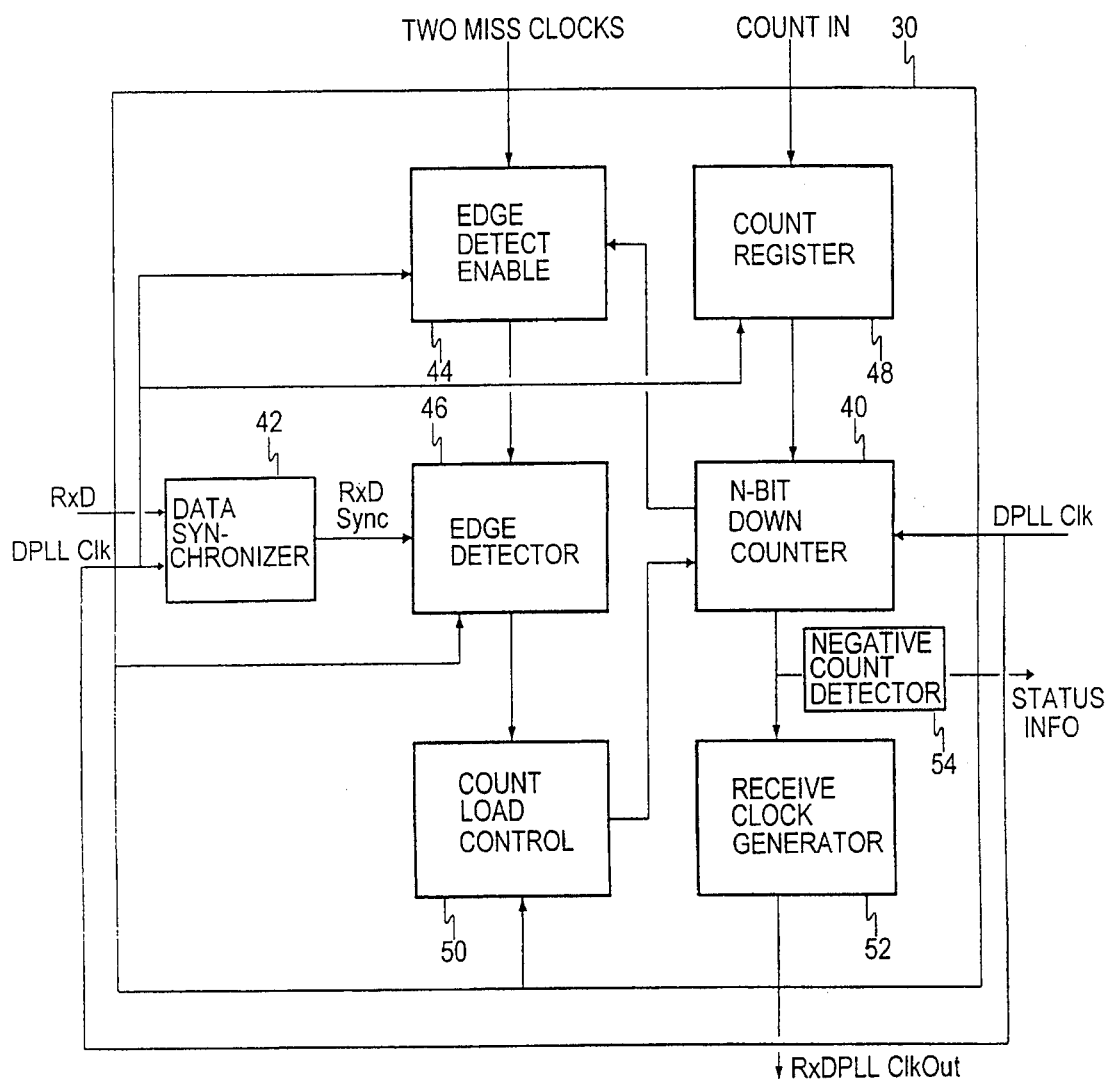
FIG. 4 is a block diagram of a digital phase-locked loop circuit constructed in accordance with an embodiment of the present invention.

FIG. 4 is a block diagram of a digital phase-locked loop 30 constructed in accordance with an embodiment of the present invention.

Instead of the up/down counters used in the prior art, the digital phase-locked loop 30 of the present invention uses an N-bit down counter 40 in order to determine when the clock transitions in a receive clock are to be made. Furthermore, no comparators or incrementors are needed with the present invention. This simplification in logic reduces power consumption and increases the reliability of the recovered clock signal.

Down counter 40 receives the digital phase-locked loop clock (DPLL clock), which is some multiple of the received data signal (Rx Data), from the clock divider network 38. For example, when the data is NRZI encoded, the DPLL clock is 32 times the received data signal. By contrast, when the data is FM encoded, the DPLL clock is set at 16 times the data rate of the received data signal.

The DPLL clock signal is also provided to a conventional data synchronizer 42 that receives at its other input the receive data signal Rx Data. The data synchronizer 42 produces from these signals a synchronized receive data signal (RxD Sync). The synchronized signal is approximately four DPLL clocks delayed from the Rx Data signal.

The synchronized received data signal (RxD Sync) is provided to an edge detector 46 that is enabled by a signal from an edge detector enable 44. Once enabled, when an edge is detected, the edge detector 46 provides a signal to a count load control circuit 50.

An adjustable start count value, such as 31 or 15, may be loaded into a count register 48 by the CPU 12. The actual value loaded into the count register is dependent upon the type of encoding of the received data. The value 31, for example, will be loaded if the data is NRZI encoded; while the value 15 will be loaded if the data is FM encoded. Under the control of the count load control 50, the counter 40 will be loaded with the value contained in the count register 48 and begin counting down from that start count value. In certain preferred embodiments of the present invention, the down counter is a 6-bit down counter.

A negative count detector 54 is coupled to the down counter 40, the purpose of the negative count detector 54 being described later. A receive clock generator 52 is coupled to the down counter 40 and generates the receive clock signal (RxDPLL clock out) that is used to determine the sampling times of the received data signal.

Figure 5:
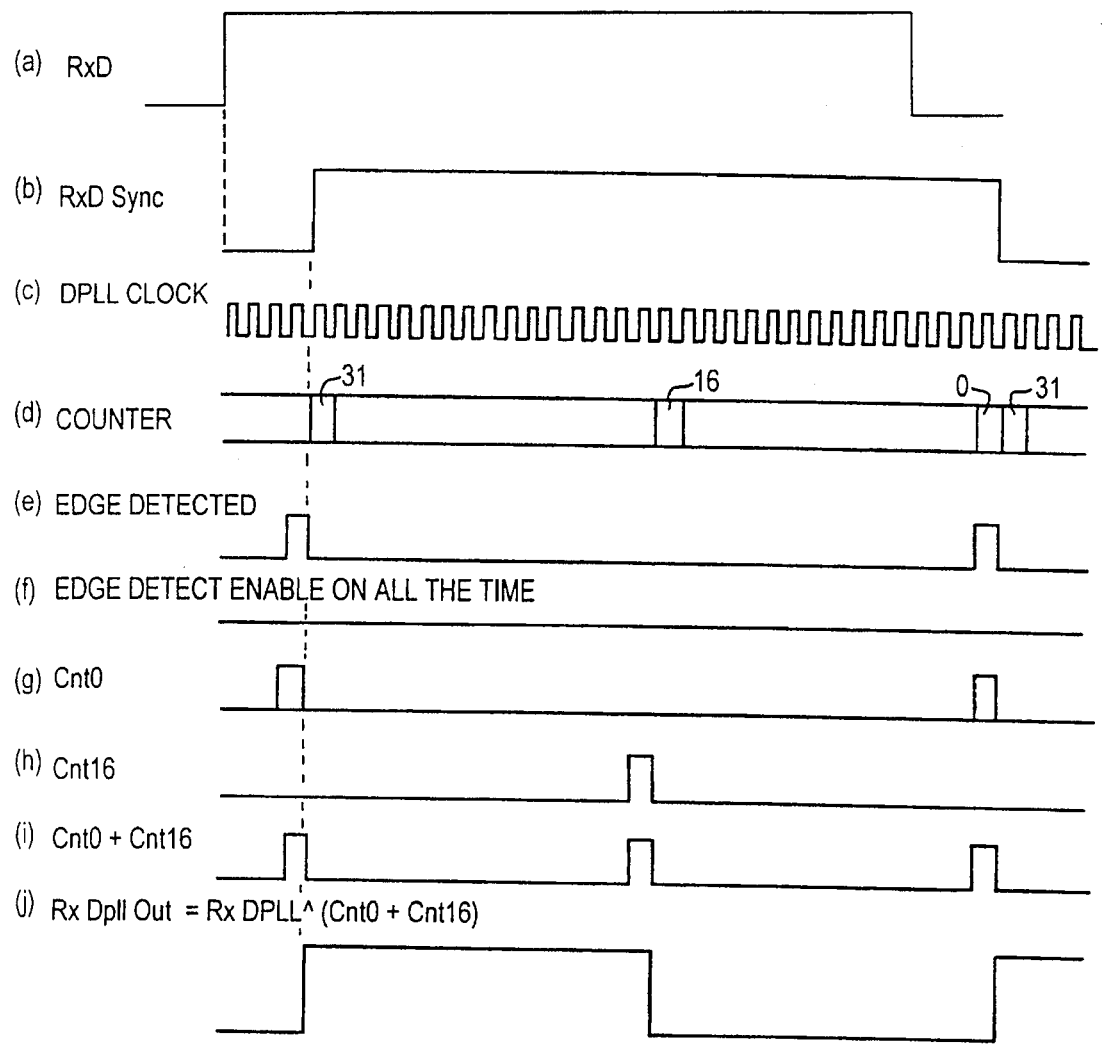
FIG. 5 is a timing diagram depicting signals when the digital phase-locked loop circuit of FIG. 4 is used in an NRZI mode.

An example of the operation of the digital phase-locked loop 30 of FIG. 4 will now be described with respect to the timing diagram of FIG. 5. In this example, the digital phase-locked loop 30 is operating in an NRZI mode since the received data is encoded in the NRZI format. In NRZI, encoding a one (1) is represented by no change in the level of the data signal and a zero (0) is represented by a change in the level.

The count register 48 is loaded with a Count In signal having a value of 31 since the data is NRZI encoded. This value of 31 forms the start count value that will be loaded into the down counter 40. The received data signal RxD is synchronized by the data synchronizer 42 to the DPLL clock signal.

When used to decode NRZI encoded data, the edge detect enable 44 is always enabled, as indicated in the timing diagram. When the first edge of the synchronized received data signal (RxD Sync) is recognized by the edge detector 46, a signal is generated by the edge detector 46 to the count load control 50. The down counter 40 receives the signal from the count load control 50 which causes the counter 40 to load the start count value (31) stored in the count register 48 into the counter 40.

The counter 40 begins counting down from the start count value 31 towards a terminal value, in this embodiment zero (0). The down counter 40 generates an output pulse when the count reaches a predetermined value, such as 16, and another output pulse when it reaches the second predetermined value such as count zero (0). From these pulses, the receive clock generator 52 will change the level of its receive clock signal (RxDPLL Out) as indicated in the timing diagram.

As can be seen from the clock signals in the timing diagram, the generated receive clock signal RxDPLL Out has a transition approximately in the middle of the received data signal RxD which corresponds to the sampling time of the received data signal RxD. However, it may occur that the received data signal RxD is not perfectly synchronized, for example, the width of the bit is more than 32 counts. In such an event, once the terminal value zero (0) is reached, and no edge has been detected, the counter 40 is simply reset to the start count value of 31. Re-synchronization occurs very quickly, however, as when the next edge is finally detected by the edge detector 46, the control load counter 50 interrupts the counting and causes the down counter 40 to once again load the start count value 31 and begin counting down again. This brings the receive clock signal (RxDPLL Out) generated by the receive clock generator 52 into synchronization in a very fast manner as the re-synchronization occurs when the very next edge in the receive data signal (RxD) is detected.

The present invention thus provides a digital phase-locked loop circuit that has simplified logic due to its use of a down counter, yet provides for a fast re-synchronization for the recovered clock signal in the event of jitter in the received data signal.

Figure 6:
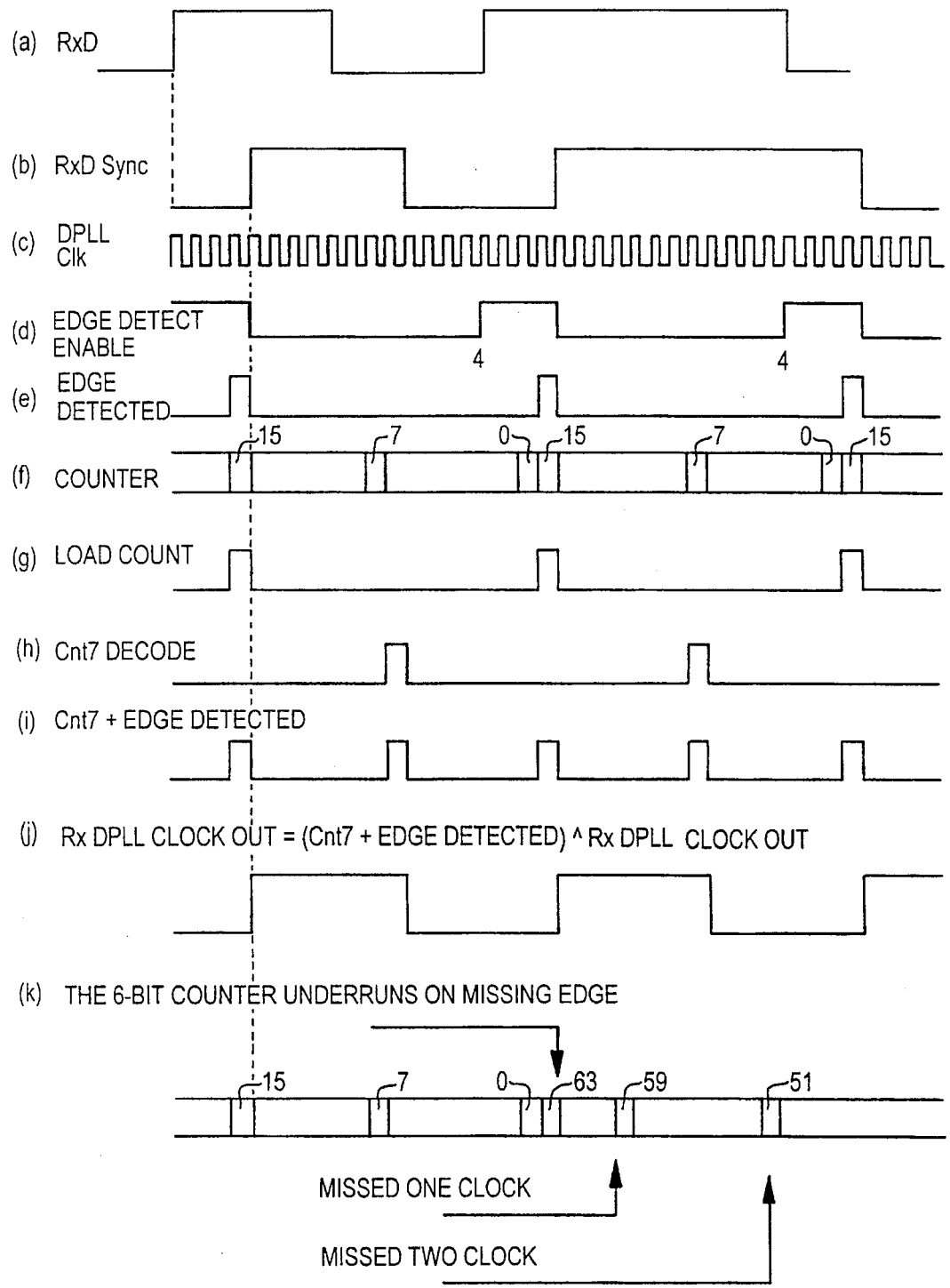
FIG. 6 is a timing diagram depicting signals when the digital phase-locked loop circuit of FIG. 4 is used in an FM mode.

The digital phase-locked loop 30 of FIG. 4 can also be used to decode other types of encoded data, such as FM encoded data. In FM encoding, a transition is present on every bit cell boundary, and an additional transition may be present in the middle of a bit cell. As shown in the timing diagram of FIG. 6, the digital phase-locked loop 30 of the present invention receives a DPLL clock that is 16 times the rate of the received data signal RxD or the synchronized received data signal (RxD Sync).

In contrast to the operation of the digital phase-locked loop 30 to recover NRZI encoded data, the edge detector enable 44 is not always on. Furthermore, the start count value stored in the count register 48 is 15, and not 31. Once an edge in the synchronized received data signal (RxD Sync) has been detected by the edge detector 46, the control load counter 50 responds to this detection to cause the down counter 40 to load the start count value (15) in the count register 48 and begin counting down. Prior to reaching the terminal value of zero, the edge detect enable 44 will be turned on by the down counter 40 when the down counter has reached the value of 4. In other words, four counts before the next edge should be present in the synchronized receive data signal (RxD Sync), the edge detector 46 will be enabled to detect this anticipated edge.

The down counter 40 generates pulses corresponding to the detection of an edge (i.e., the loading of the count) and when the count reaches the value of seven (7). The receive clock generator 52 generates the receive clock signal (RxDPLL Out) from these pulses. This generated receive clock signal has transitions at one-fourth and three-fourths the bit time of the received data signal (RxD) so that the data signal will be properly sampled.

When synchronization is lost, for example, when a next edge is late in arriving, the counter 40 will underflow below the terminal value. As the edge detector enable 44 will no longer be enabled (after 4 counts) there needs to be a means for enabling the edge detector 46 in the event of a missing edge to re-synchronize the counter 40 to the received data signal. For this purpose, the negative count detector 54 determines when there is an underflow in the counter 40. Upon reaching the negative count or underflow, the negative count detector provides a status information signal to the CPU 12. In preferred embodiments of the present invention, the status information signal is provided to the CPU 12 after there have been two missed clocks. The CPU 12 will then send a Two Miss Clocks signal to the edge detect enable circuit 44 to cause it to enable the edge detector 46. Thus, the edge detect enable 44 does not need to wait for the signal from the down counter 40 before it enables the edge detector 46 if there has been two missed clocks. Once the next edge is detected, the count will again be loaded and the counter 40 re-synchronized. The present invention thus provides a digital phase-locked loop circuit that can be used to recover clock information from streams of data that have been encoded according to different encoding schemes, and does so with simplified logic that reduces power consumption and increases the reliability of a clock.

Although an embodiment has been described which uses a down counter, it should be apparent to one of ordinary skill in the art that an up counter could be substituted for the down counter. This involves changing the start count values stored in the count register and the terminal value and predetermined values within the count. For instance, in the operation of a digital phase-locked loop 30 to decode FM encoded data, the counter would begin counting at 0 and be incremented to 15. The predetermined value in the middle of the count would be 8, instead of 7. Such a change to an up counter instead of a down counter does not depart from the spirit or scope of the present invention.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A digital phase-locked loop for receiving an encoded stream of data and generating a receive clock signal therefrom, the digital phase-locked loop comprising:

a counter having an adjustable start count value;

an edge detector that detects rising and falling edges within a stream of data, the detection of an edge causing the counter to start counting from the start count value towards a terminal value; and a receive clock generator that generates a receive clock signal, the receive clock generator changing a level of the receive clock signal in response to the counter reaching at least a first predetermined value.

2. The digital phase-locked loop of claim 1, further comprising an edge detector enable responsive to the counter to enable the edge detector to detect a next edge within the stream of data.

3. The digital phase-locked loop of claim 1, wherein the counter is a unidirectional counter.

4. The digital phase-locked loop of claim 3, wherein the unidirectional counter is a down counter.

5. The digital phase-locked loop of claim 1, further comprising a count register in which the start count value is stored, and a count load control responsive to the edge detector to load the start count value into the counter upon the detection of an edge.

6. The digital phase-locked loop of claim 1, wherein the data is encoded in non-return to zero inverted (NRZI) format.

7. The digital phase-locked loop of claim 6, wherein the counter is driven by a clock that is 32 times a data rate of the stream of data.

8. The digital phase-locked loop of claim 2, wherein the data is encoded in frequency modulated (FM) format.

9. The digital phase-locked loop of claim 8, wherein the counter is driven by a clock that is 16 times a data rate of the stream of data.

10. The digital phase-locked loop of claim 8, wherein the receive clock generator is responsive to the detection of an edge and the first predetermined value to change the levels of the receive clock signal, the detection of the edge occurring at one fourth of a difference between the start count value and the terminal value, and the first predetermined value occurring at three fourths of the difference between the start count value and the terminal value.

11. The digital phase-locked loop of claim 8, further comprising a negative count detector that detects underflows below the terminal value in the counter and generates a status signal in response thereto that indicates at least one missed clock, the status signal causing the edge detector to be enabled.

12. A system for receiving a stream of encoded digital data and recovering clock information from the stream to clock the stream, the system comprising:

a processing unit; and a serial communications controller responsive to the processing unit and receiving the stream of encoded digital data, the serial communications controller including:

a receiver that receives the stream of encoded digital data; and a digital phase-locked loop that receives the stream of encoded digital data and recovers the clock information therefrom, wherein the digital phase-locked loop includes a counter having an adjustable start count value, an edge detector that detects rising and falling edges within a stream of data, the detection of an edge causing the counter to start counting from the start count value towards a terminal value, and a receive clock generator that generates a receive clock signal, the receive clock generator changing a level of the receive clock signal in response to the counter reaching at least a first predetermined value.

13. The system of claim 12, wherein the digital phase-locked loop further includes an edge detector enable responsive to the counter to enable the edge detector to detect a next edge within the stream of data.

14. The system of claim 13, wherein the digital phase-locked loop further includes a count register in which the start count value is stored, and a count load control responsive to the edge detector to load the start count value into the counter upon the detection of an edge, the processing unit providing the start count value to the count register.

15. The system of claim 14, wherein the data is encoded in non-return to zero inverted (NRZI) format, and the receiver is responsive to the change in the level of the receive clock signal upon the counter reaching the at least first predetermined value to sample the stream of encoded digital data.

16. The system of claim 15, wherein the serial communications controller further includes a clock divider that produces a clock signal for driving the counter that is 32 times a data rate of the stream of encoded digital data.

17. The system of claim 13, wherein the data is encoded in frequency modulated (FM) format, and the receive clock generator is responsive to the detection of an edge and the first predetermined value to change the levels of the receive clock signal, the detection of the edge occurring at one fourth of a difference between the start count value and the terminal value, and the first predetermined value occurring at three fourths of the difference between the start count value and the terminal value, the receiver being responsive to the changes in the level of the receive clock signal to sample the stream of encoded digital data.

18. The system of claim 17, wherein the serial communications controller further includes a clock divider that produces a clock signal for driving the counter that is 16 times a data rate of the stream of encoded digital data.

19. The system of claim 18, further comprising a negative count detector that detects underflows below the terminal value in the counter and generates a status signal to the processing unit in response thereto that indicates at least two missed clocks, the processor being responsive to the status signal to generate a two missed clocks signal that causes the edge detector enable to enable the edge detector to detect the next edge in the stream of encoded digital data.

20. A method of generating a receive clock signal from an encoded data stream with a digital phase-locked loop having a unidirectional counter, an edge detector, an edge detector enable, and a receive clock generator, the method comprising:

loading the counter with a start count value;

driving the counter with a clock signal that is a multiple of a data rate of the stream of encoded data;

detecting with the edge detector rising and falling edges within the stream of data, the detection of an edge causing the counter to start counting from the start count value towards a terminal value; and changing a level of a receive clock signal generated by the receive clock generator when the counter reaches at least one predetermined value.

21. The method of claim 20, further comprising enabling the edge detector with the edge detector enable when the counter reaches a second predetermined value, such that the edge detector will detect a next edge within the stream of encoded digital data.

22. The method of claim 20, wherein the data is encoded in non-return to zero inverted (NRZI) format, and the receiver is responsive to the change in the level of the receive clock signal upon the counter reaching the at least first predetermined value to sample the stream of encoded digital data.

23. The method of claim 22, further comprising producing with a clock divider a clock signal for driving the counter that is 32 times a data rate of the stream of encoded digital data.

24. The method of claim 21, wherein the data is encoded in frequency modulated (FM) format, the receive clock generator being responsive to the detection of an edge and the first predetermined value to change the levels of the receive clock signal, the detection of an edge occurring at one fourth of a bit length of data, and first predetermined value at three fourths of the bit length of data, and further comprising sampling the stream of encoded digital data with a receiver in response to the changes in the level of the receive clock signal.

25. The method of claim 24, further comprising producing with a clock divider a clock signal for driving the counter that is 16 times a data rate of the stream of encoded digital data.

26. The method of claim 25, further comprising detecting underflows below the terminal value in the counter and generating a status signal to a processing unit in response thereto that indicates at least two missed clocks, the processor being responsive to the status signal to generate a two missed clocks signal that causes the edge detector enable to enable the edge detector to detect the next edge in the stream of encoded digital data.

\* \* \* \* \*